(12) United States Patent
Tamir et al.

(10) Patent No.: US 10,275,558 B2
(45) Date of Patent: Apr. 30, 2019

(54) TECHNOLOGIES FOR PROVIDING FPGA INFRASTRUCTURE-AS-A-SERVICE COMPUTING CAPABILITIES

(71) Applicant: Intel Corporation, Santa Clara, CA (US)

(72) Inventors: Eliezer Tamir, Beit Shemesh (IL); Ben-Zion Friedman, Jerusalem (IL); Alexey Puzhevich, Tzur Hadassah (IL); Shai Krigman, Ofra (IL)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 15/344,923

(22) Filed: Nov. 7, 2016

(65) Prior Publication Data

US 2018/0129770 A1    May 10, 2018

(51) Int. Cl.
*G06F 17/50* (2006.01)
*G06F 13/16* (2006.01)
*G06F 13/28* (2006.01)

(52) U.S. Cl.
CPC ...... *G06F 17/5054* (2013.01); *G06F 13/1673* (2013.01); *G06F 13/28* (2013.01)

(58) Field of Classification Search
CPC .. G06F 17/5027; G06F 17/5054; G06F 21/76; G06F 13/28; G06F 17/5045

USPC ......................................... 716/102, 116–117
See application file for complete search history.

(56) References Cited

U.S. PATENT DOCUMENTS

2003/0046668 A1\*    3/2003    Bowen ................ G06F 17/5045
                                              717/131

\* cited by examiner

*Primary Examiner* — Paul Dinh
(74) *Attorney, Agent, or Firm* — Barnes & Thornburg LLP

(57) ABSTRACT

Technologies for providing FPGA infrastructure-as-a-service include a computing device having an FPGA, scheduler logic, and design loader logic. The scheduler logic selects an FPGA application for execution and the design loader logic loads a design image into the FPGA. The scheduler logic receives a ready signal from the FGPA in response to loading the design and sends a start signal to the FPGA application. The FPGA executes the FPGA application in response to sending the start signal. The scheduler logic may time-share the FPGA among multiple FPGA applications. The computing device may include signaling logic to manage signals between a user process and the FPGA application and DMA logic to manage bulk data transfer between the user process and the FPGA application. The computing device may include a user process linked to an FGPA library executed by a processor of the computing device. Other embodiments are described and claimed.

25 Claims, 3 Drawing Sheets

TECHNOLOGIES FOR PROVIDING FPGA INFRASTRUCTURE-AS-A-SERVICE COMPUTING CAPABILITIES

BACKGROUND

Certain computing devices may include one or more field programmable gate arrays (FPGAs). FPGAs are computer processing circuits that include configurable logical blocks, data interconnects, and other programmable digital logic resources. Thus, an FPGA may be configured to perform various tasks typically performed by an application-specific integrated circuit (ASIC) or other fixed hardware resource. An FPGA may be configured by installing an FPGA image, which may include a hardware definition such as a bitstream, a hardware definition language program (e.g., a VHDL program), or other hardware definition. FPGAs are typically programmed statically at boot time.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
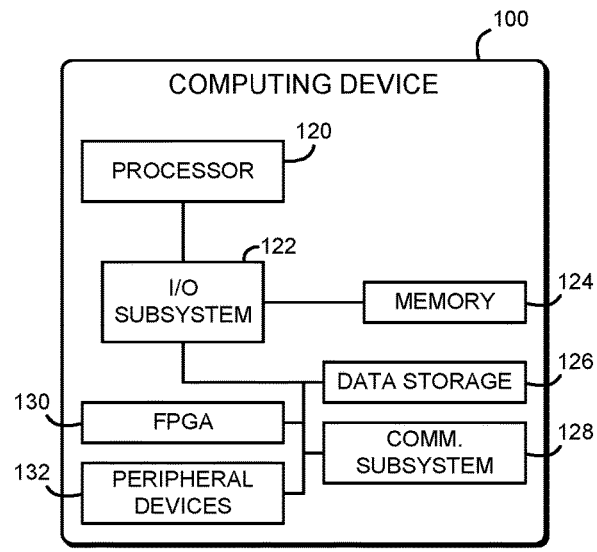
FIG. 1 is a simplified block diagram of at least one embodiment of a computing device for providing FPGA infrastructure-as-a-service (FAAS) computing capabilities.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one of A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, in an illustrative embodiment, a computing device 100 for providing FPGA infrastructure-as-a-service (FAAS) capabilities includes one or more processors 120 and at least one FPGA 130. In use, as described further below, the computing device 100 may execute multiple user processes that each access an FPGA middleware library and/or an FPGA driver. The FGPA library and the FGPA driver provide a standardized, non-proprietary interface to the capabilities of the FPGA 130. In use, a user process specifies an FPGA design file for an FPGA application. Scheduler glue logic of the computing device 100 determines when to run the FPGA application, and design loader glue logic loads the FPGA design file into the FPGA 130. The scheduler glue logic may employ one of several potential scheduling policies, including time-sharing and/or space-sharing of the FPGA 130. Resource manager glue logic may track and reserve FGPA resources allocated to each FPGA application. Direct memory access (DMA) glue logic and signaling glue logic may coordinate control signaling and bulk data transfer between the system memory space of the user application and the FPGA application. Thus, the computing device 100 may allow the use of FPGA applications in a dynamic manner, allowing user applications to specify and execute FPGA applications at runtime. The computing device 100 also enforces isolation and memory protection between the FPGA applications, for example using an IOMMU and/or a TLB or IOTLB to enforce access permissions for memory transactions. By allowing dynamic execution of FPGA applications with security protections such as isolation and memory protection, the computing device 100 may allow the use of FPGA applications within cloud computing, data center, or other multiuser environments. Additionally, the use of the FPGA middleware library 206 and the FPGA driver 208 may allow for modifications to the FPGA 130 and/or the glue logic without requiring modifications to user applications.

The computing device 100 may be embodied as any type of computation or computer device capable of performing the functions described herein, including, without limitation, a computer, a desktop computer, a workstation, a server, a laptop computer, a notebook computer, a tablet computer, a mobile computing device, a wearable computing device, a network appliance, a web appliance, a distributed computing system, a processor-based system, and/or a consumer electronic device. As shown in FIG. 1, the computing device 100 illustratively includes a processor 120, an input/output subsystem 122, a memory 124, a data storage device 126, and a communication subsystem 128. Of course, the computing device 100 may include other or additional components, such as those commonly found in a desktop computer (e.g., various input/output devices), in other embodiments. Additionally, in some embodiments, one or more of the illustrative components may be incorporated in, or otherwise form a portion of, another component. For example, the memory 124, or portions thereof, may be incorporated in the processor 120 in some embodiments.

The processor 120 may be embodied as any type of processor capable of performing the functions described herein. The processor 120 may be embodied as a single or multi-core processor(s), digital signal processor, microcontroller, or other processor or processing/controlling circuit. Although illustrated as including a single processor 120, it should be understood that in some embodiments, the computing device 100 may include multiple processors 120, for example in a multi-socket configuration. Similarly, the memory 124 may be embodied as any type of volatile or non-volatile memory or data storage capable of performing the functions described herein. In operation, the memory 124 may store various data and software used during operation of the computing device 100 such as operating systems, applications, programs, libraries, and drivers. The memory 124 is communicatively coupled to the processor 120 via the I/O subsystem 122, which may be embodied as circuitry and/or components to facilitate input/output operations with the processor 120, the memory 124, and other components of the computing device 100. For example, the I/O subsystem 122 may be embodied as, or otherwise include, memory controller hubs, input/output control hubs, I/O memory management units, platform controller hubs, integrated control circuitry, firmware devices, communication links (i.e., point-to-point links, bus links, wires, cables, light guides, printed circuit board traces, etc.) and/or other components and subsystems to facilitate the input/output operations. In some embodiments, the I/O subsystem 122 may form a portion of a system-on-a-chip (SoC) and be incorporated, along with the processor 120, the memory 124, the FPGA 130, and other components of the computing device 100, on a single integrated circuit chip.

The data storage device 126 may be embodied as any type of device or devices configured for short-term or long-term storage of data such as, for example, memory devices and circuits, memory cards, hard disk drives, solid-state drives, or other data storage devices. In some embodiments, the data storage device 126 may be used to store one or more FPGA application images.

The communication subsystem 128 of the computing device 100 may be embodied as any communication circuit, device, or collection thereof, capable of enabling communications between the computing device 100 and other remote devices over a network. The communication subsystem 128 may be configured to use any one or more communication technology (e.g., wired or wireless communications) and associated protocols (e.g., Ethernet, InfiniBand® or other cluster interconnects, Bluetooth®, Wi-Fi®, WiMAX, etc.) to effect such communication.

As described above, the computing device 100 includes at least one FPGA 130. The FPGA 130 may be embodied as an integrated circuit including programmable digital logic resources that may be configured after manufacture. The FPGA 130 may include, for example, a configurable array of logic blocks in communication over a configurable data interchange. The FPGA 130 may access data stored in the memory 124, for example using direct memory access logic, as described further below. The FPGA 130 may be capable of general purpose data transfer as well as data transfer for inline memory pipes (e.g., for a network controller with an FGPA 130 in its data pipeline). The FPGA 130 may be coupled to the processor 120 via a peripheral bus such as a PCI express bus, via an inter-processor interconnect such as an in-die interconnect (IDI) or QuickPath Interconnect (QPI), or via any other appropriate interconnect. Although illustrated in FIG. 1 as a discrete component separate from the processor 120 and/or the I/O subsystem 122, it should be understood that in some embodiments one or more of the FPGA 130, the processor 120, the I/O subsystem 122, and/or the memory 124 may be incorporated in the same package and/or in the same computer chip, for example in the same system-on-a-chip (SoC).

As shown, the computing device 100 may also one or more peripheral devices 132. The peripheral devices 132 may include any number of additional input/output devices, interface devices, and/or other peripheral devices. For example, in some embodiments, the peripheral devices 132 may include a display, touch screen, graphics circuitry, keyboard, mouse, speaker system, microphone, network interface, and/or other input/output devices, interface devices, and/or peripheral devices.

The computing device 100 is illustratively embodied as a single server computing device; however in some embodiments the computing device 100 may be embodied as a collection of servers and associated devices. For example, in some embodiments, the computing device 100 may be embodied as a "virtual server" formed from multiple computing devices distributed across a network and operating in a public or private cloud. Accordingly, although the computing device 100 is illustrated in FIG. 1 and described below as embodied as a single computing device, it should be appreciated that the computing device 100 may be embodied as multiple devices cooperating together and/or a computing cluster to facilitate the functionality described below.

Figure 2:
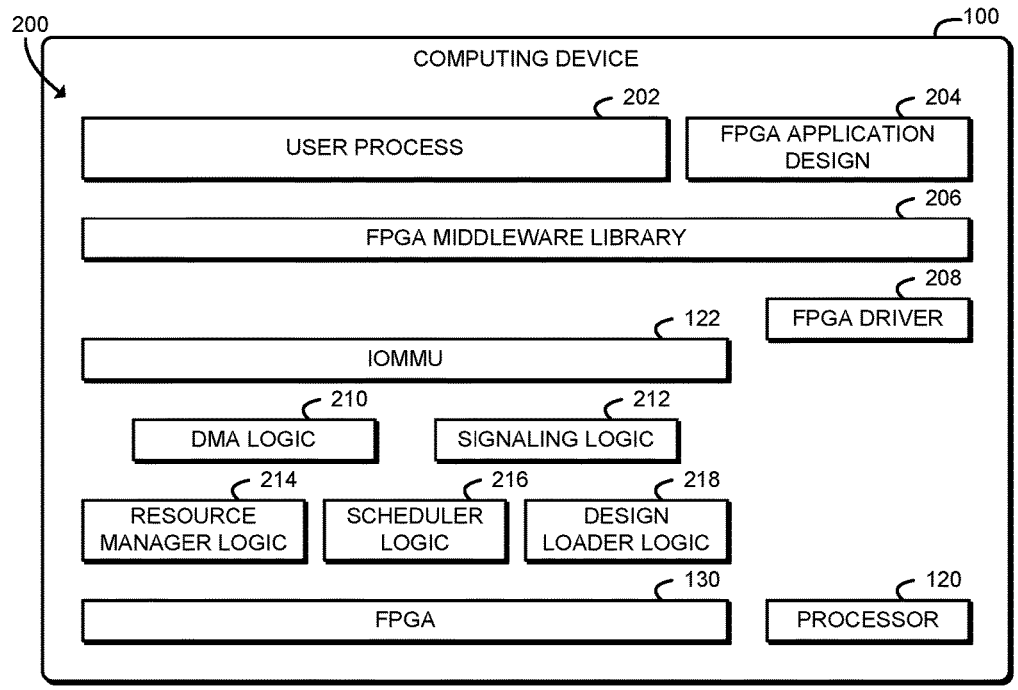
FIG. 2 is a simplified block diagram of at least one embodiment of an environment that may be established by the computing device of FIG. 1.

Referring now to FIG. 2, in an illustrative embodiment, the computing device 100 establishes an environment 200 during operation. The illustrative environment 200 includes a user process 202, an FPGA application design 204, an FPGA middleware library 206, an FPGA driver 208, a direct memory access (DMA) logic 210, a signaling logic 212, a resource manager logic 214, a scheduler logic 216, and a design loader logic 218. The various components of the environment 200 may be embodied as hardware, firmware, software, or a combination thereof. As such, in some embodiments, one or more of the components of the environment 200 may be embodied as circuitry or collection of electrical devices (e.g., user process circuitry 202, FPGA application design circuitry 204, FPGA middleware library circuitry 206, FPGA driver circuitry 208, DMA circuitry 210, signaling circuitry 212, resource manager circuitry 214, scheduler circuitry 216, and/or design loader circuitry 218). It should be appreciated that, in such embodiments, one or more of the user process circuitry 202, the FPGA application design circuitry 204, the FPGA middleware library circuitry 206, the FPGA driver circuitry 208, the DMA circuitry 210, the signaling circuitry 212, the resource manager circuitry 214, the scheduler circuitry 216, and/or the design loader circuitry 218 may form a portion of one or more of the processor 120, the I/O subsystem 122, the FPGA 130, and/or other components of the computing device 100. In particular, in some embodiments, the DMA logic 210, the signaling logic 212, the resource manager logic 214, the scheduler logic 216, and/or the design loader logic 218 may be embodied as fixed-function hardware logic such as an integrated circuit logic chip (e.g., an application-specific integrated circuit) or a functional block of the processor 120, the I/O subsystem 122, or other component of the computing device 100. Additionally or alternatively, one or more of the DMA logic 210, the signaling logic 212, the resource manager logic 214, the scheduler logic 216, and/or the design loader logic 218 may be embodied as FPGA designs executed by the FPGA 130. Unlike an FPGA application as described below, those FPGA designs may not be modifiable and/or accessible by the user of the computing device 100. Additionally, in some embodiments, one or more of the illustrative components may form a portion of another component and/or one or more of the illustrative components may be independent of one another.

The user process 202 may be embodied as any application process, thread, or other program that may be executed by a user of the computing device 100. In some embodiments, the user process 202 may include a guest operating system, virtual machine, or other virtualized process of the computing device 100. Although illustrated with a single user process 202, it should be understood that the computing device 100 may execute many user processes 202, and each user process 202 may be associated with a different user. Thus, the computing device 100 may enforce security boundaries between user processes 202 and between the FPGA applications associated with the user processes 202.

The FPGA middleware library 206 may be embodied as a dynamically and/or statically linked library that may be accessed by the user process 202 to use the FPGA 130. The FPGA middleware library 206 provides a concise, user-facing programming interface to the FPGA 130. Thus, the FPGA middleware library 206 may be embodied as computer code executed by the processor 120 rather than, for example, a library of FPGA functions to be loaded in the FGPA 130. The FPGA driver 208 may be embodied as an operating system driver or other code capable of controlling the FPGA 130. In particular, the FPGA driver 208 may provide the operating system with a standardized application programming interface (API) to the FPGA 130. The operating system may use the API to control FPGA application scheduling, billing, resource permissions, and other management functions.

The scheduler logic 216 is configured to select an FPGA application for execution by the FPGA 130. The scheduler logic 216 may be further configured to receive a ready signal from the FPGA application in response to loading an FPGA application design 204 to the FPGA 130 and to send a start signal to the FPGA application in response to receiving the ready signal. The scheduler logic 216 may be further configured to determine whether a timeslice has elapsed in response executing the FPGA application, to send a stop signal to the FPGA application if the timeslice has elapsed, receive a ready signal from the FPGA application in response to sending the stop signal, and then select another FPGA application for execution by the FPGA 130.

The design loader logic 218 is configured to load the FPGA application design 204 of the FPGA application into the FPGA 130 in response to selection of the FPGA application. The FPGA application design 204 may be embodied as an FPGA design image file such as a bitstream, a VHDL program, or any other module definition for the FPGA 130. The FGPA application design 204 may be encoded with a standardized format that may be interpreted by the FPGA middleware library 206 and/or the FPGA driver 208 and then programmed to the FPGA 130. The FPGA application design 204 may be supplied by a user, e.g., by the user of the user application 202. The FPGA application design 204 may implement one or more predetermined FPGA interfaces, which may allow the user to select from, combine, or otherwise use multiple FGPA application designs 204 with the computing device 100. Additionally or alternatively, in some embodiments, the FPGA application design 204 may be selected from one or more pre-packaged applications provided by the computing device 100, for example to provide commonly used functions.

The FGPA 130 is to execute the FPGA application in response to being sent the start signal from the scheduler logic 216. In some embodiments, the FPGA 130 may be further configured to store, by the FPGA application, an internal state of the FPGA application in response to being sent the stop signal from the scheduler logic 216 and to send the ready signal after storing the internal state. In some embodiments, the FPGA 130 may be further configured to restore, by the FPGA application, the internal state of the FPGA application in response to being sent the start signal from the scheduler logic 216 and to send the ready signal after restoring the internal state.

The signaling logic 212 is configured to manage signaling between the FPGA application and the user process 202, including control messages, start/stop commands, ready signals, and other signals. In some embodiments, the FPGA application may read work requests from a command queue in the memory 124 with the signaling logic 212 and store completions to a completion queue in the memory 124 with the signaling logic 212. Access restrictions to the command queue and the completion queue may be enforced by an I/O memory management unit (IOMMU) of the computing device 100, which may be included in the I/O subsystem 122. For example, access restrictions may be enforced by a system-wide IOMMU such as Intel® VT-d or by an IOMMU dedicated to the FPGA 130. The FPGA middleware library 206 may be configured to allocate the command queue and the completion queue. The user process 202 may be configured to store work requests in the command queue and read completions from the completion queue.

The DMA logic 210 is configured to manage bulk data transfer between the system memory 124 and the FPGA 130. In some embodiments, the FPGA application may access one or more data buffers in the memory 124 with the DMA logic 210. Access restrictions to the DMA data buffers may be enforced by an IOMMU of the computing device 100, which may be included in the I/O subsystem 122. The FPGA middleware library 206 may be configured to allocate the data buffers. The user process 202 may be configured to store application data in the data buffers.

The resource manager logic 214 is configured to reserve one or more resources of the FPGA 130 for the FPGA application. The user process 202 may be configured to request the FPGA middleware library 206 to reserve the resources of the FGPA 130 for the FPGA application. The resource manager logic 214 may be configured to reserve the one or more resources of the FPGA 130 in response to the request to the FPGA middleware library 206. In some embodiments, the resource manager logic 214 may be further configured to prevent access by the FPGA application to one or more resources of the FPGA 130 that are reserved for another FGPA application (e.g., preventing access to application code or data within the FPGA 130).

In some embodiments, the computing device 100 may employ a multi-tenant space-sharing strategy to partition, slice, or otherwise isolate multiple FGPA applications on the same FPGA 130. Thus, in some embodiments the scheduler logic 216 may be configured to select one or more additional FPGA applications for execution by the FPGA 130, the resource manager logic 214 may be further configured to reserve resources of the FPGA 130 for the additional FPGA applications, and the design loader logic 218 may be further configured to load an FPGA application design 204 image file of the additional FPGA applications into the FPGA 130. Additionally or alternatively, in some embodiments the computing device 100 may include multiple FPGAs 130, and the scheduler logic 216 may be configured to select one or more additional FPGA applications for execution by the additional FPGAs 130, the resource manager logic 214 may be further configured to reserve resources of the additional FPGAs 130 for the additional FPGA applications, and the design loader logic 218 may be further configured to load an FPGA application design 204 image file of the additional FPGA applications into the additional FPGAs 130.

In some embodiments, the user process 202 may be further configured to query the FPGA middleware library 206 for capabilities of the FPGA 130. In some embodiments, the user process 202 may be further configured to specify the FPGA application design 204 of the FPGA application to the FPGA middleware library 206. In some embodiments, the user process 202 may be further configured to register one or more event callbacks with the FPGA middleware library 206, and the FPGA middleware library 206 may be further configured to invoke the corresponding event callback in response executing the FPGA application. In some embodiments, the user process 202 may be further configured to invoke the FPGA middleware library 206 to start the FPGA application. The scheduler logic 216 may be configured to select the FPGA application in response to invocation of the FPGA library 206.

Figure 3:
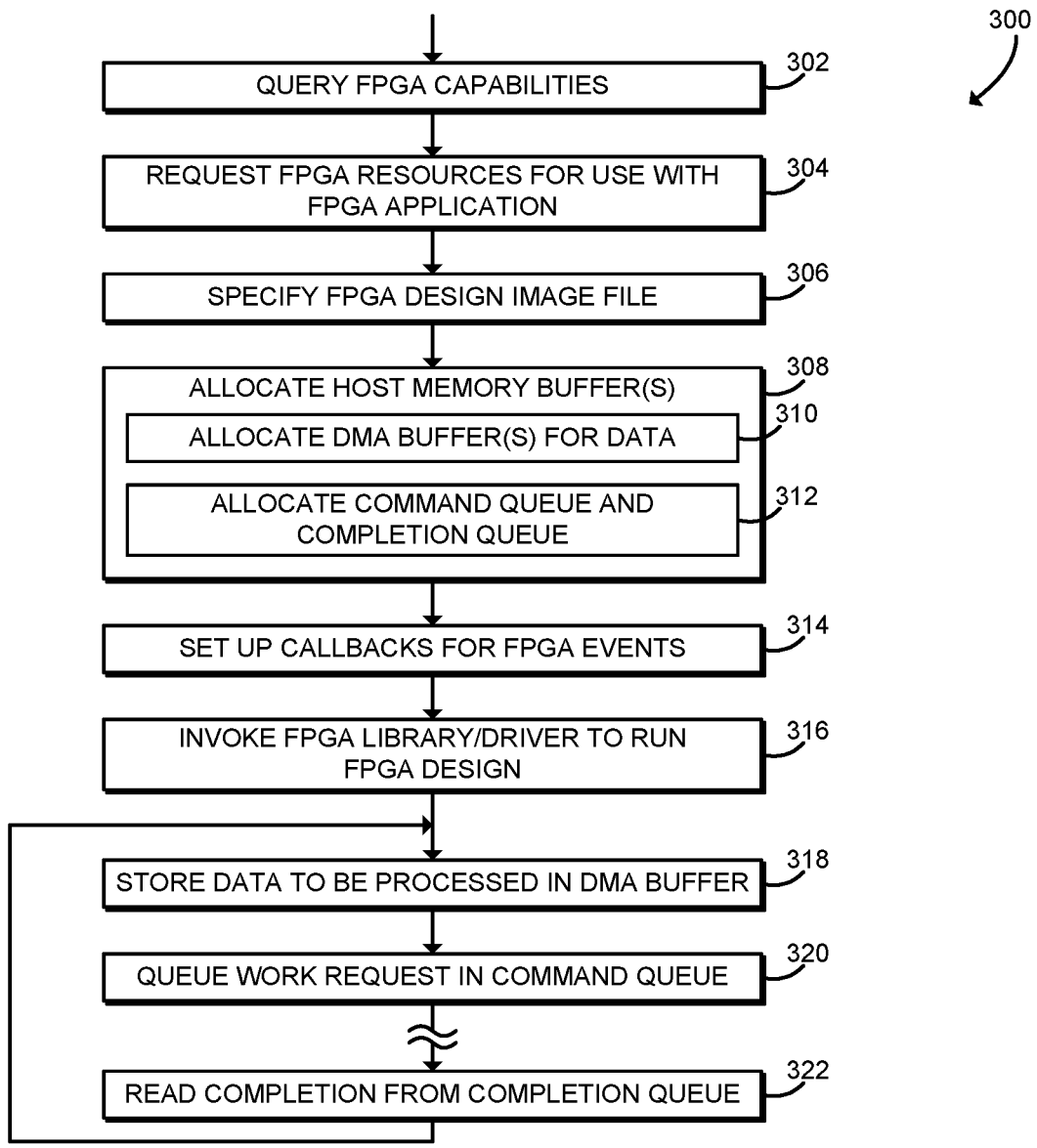
FIG. 3 is a simplified flow diagram of at least one embodiment of a method for accessing FAAS capabilities that may be executed by the computing device of FIGS. 1-2.

Referring now to FIG. 3, in use, the computing device 100 may execute a method 300 for accessing FPGA infrastructure-as-a-service capabilities. It should be appreciated that, in some embodiments, the operations of the method 300 may be performed by one or more components of the environment 200 of the computing device 100 as shown in FIG. 2. The method 300 begins in block 302, in which the computing device 100 may query the capabilities of the FPGA 130. For example, the user process 202 may query the FPGA middleware library 206 for the capabilities of the FPGA 130, and the FPGA middleware library 206 and/or the FPGA driver 208 may identify those capabilities. The user process 202 may use the identified capabilities to determine whether resources required by the FPGA application design 204 are available on the FPGA 130.

In block 304, the computing device 100 requests FPGA resources for use with an FPGA application described by the FPGA application design 204. For example, the computing device 100 may request gates, clocks, I/O bandwidth, available power, local memory, or other resources required by the FPGA application. The user process 202 may submit the request for resources to the FPGA middleware library 206, and the FPGA middleware library 206 may respond with a software handle, descriptor, pointer, or other identifier that may be used to access the reserved FPGA resources. The FPGA middleware library 206 and/or the FPGA driver 208 may communicate with the resource manager logic 214 to reserve the resources of the FPGA 130, as described further below in connection with FIG. 4.

In block 306, the computing device 100 specifies the FPGA application design 204 for the FPGA application. For example, the user process 202 may submit FGPA design image file contents, a file name, or other identifier of the image file for the FPGA application design 204 to the FPGA middleware library 206. The FPGA application design 204 may be embodied as an FGPA image file such as a bitstream, VHDL program, and/or any other module definition for the FPGA 130. In some embodiments, the FPGA application design 204 may be encoded in a standardized format that may be interpreted by the FPGA middleware library 206 and/or the FPGA driver 208 and then programmed to the FPGA 130. The FPGA middleware library 206 and/or the FPGA driver 208 may communicate with the design loader logic 218 to load the FPGA application design 204, as described further below in connection with FIG. 4.

In block 308, the computing device 100 may allocate one or more host memory buffers in the memory 124 for use in communication with the FPGA 130. For example, the memory buffers may be allocated by the FPGA middleware library 206 in the virtual memory space of the user process 202. Thus, the contents of the memory buffers may be protected from access by other processes of the computing device 100 using memory protections provided by an operating system, hypervisor, and/or other control entity of the computing device 100. In block 310, the computing device 100 may allocate one or more direct memory access (DMA) data buffers for application data. As described further below, the DMA data buffers may be used for bulk data transfer between the user process 202 and the FPGA application. Communication between the user process 202 and the FPGA application may be bi-direction. For example, in some embodiments the computing device 100 may allocate two unidirectional FIFOs to be used for DMA data transfer. In block 312, the computing device 100 may allocate a command queue and a completion queue to be used for signaling with the FPGA application. Each of the command queue and the completion queue may be embodied as a first-in-first-out (FIFO) queue in the memory 124. As described further below, the user process 202 may submit work requests or other commands to the FPGA 130 in the command queue, and the FPGA 130 may respond with completions in the completion queue when a work request is completed.

In bloc 314, the computing device 100 sets up one or more callbacks to handle FPGA events. For example, the user process 202 may supply a function pointer and/or other callback routine to the FPGA middleware library 206 for each FPGA event to be handled. FPGA events may include the generation of completions, FPGA errors, or other events generated by the FPGA 130. In response to an event generated by the FPGA 130, the FPGA middleware library 206 and/or the FPGA driver 208 may invoke the user process 202 at the supplied callback in order to handle the event.

In block 316, the computing device 100 invokes the FPGA middleware library 206 and/or the FPGA driver 208 to execute the FPGA application design 204. For example, the user process 202 may invoke the FPGA middleware library 206 to execute the FGPA application design 204, which in turn may invoke the FPGA driver 208. The FPGA driver 208 may cause the FPGA 130 to start executing the FPGA application design 204 by signaling the scheduler logic 216 to start executing the FPGA application design 204. The FPGA driver 208 may use any appropriate technique to signal the scheduler logic 216. For example, in some embodiments, the FPGA driver 208 may store one or more commands in the command queue in order to signal the scheduler logic 216. The scheduler logic 216 may cause the FPGA application design 204 to be loaded and executed as described further below in connection with FIG. 4.

In block 318, the computing device 100 may store application data to be processed in one or more DMA data buffers. For example, the user process 202 may store the application data into a DMA buffer allocated by the FPGA middleware library 206 as described above in connection with block 308. In some embodiments, the computing device 100 may continue to allocate additional DMA data buffers during execution of the FPGA application.

In block 320, the computing device 100 may queue a work request in the command queue that was allocated as described above in connection with block 308. For example, the user process 202, the FPGA middleware library 206, and/or the FPGA driver 208 may store a work request in the command queue. As described further below in connection with FIG. 4, after queuing the work request the FPGA 130 may execute the FPGA application as requested by the work request. During execution, the FPGA application may process the application data stored in one or more DMA data buffers as described above in connection with block 318. After queuing the work request, the computing device 100 (e.g., the user process 202) may yield execution or otherwise wait for the FPGA application to complete processing the work request.

When the FPGA application completes processing the work request, the FPGA 130 may store a completion in the completion queue, as described further below in connection with FIG. 4. In block 322, after the FPGA 130 has stored a completion in the completion queue, the computing device 100 reads the completion from the completion queue. For example, the user process 202 may execute a callback handler that reads the completion from the completion queue. After reading the completion, the computing device 100 may continue execution of the user process 202, for example by reading application data from one or more DMA data buffers that include data stored by the FPGA 130. After reading the completion, the method 300 loops back to block 318, in which the computing device 100 may continue to store application data and queue work requests.

Figure 4:
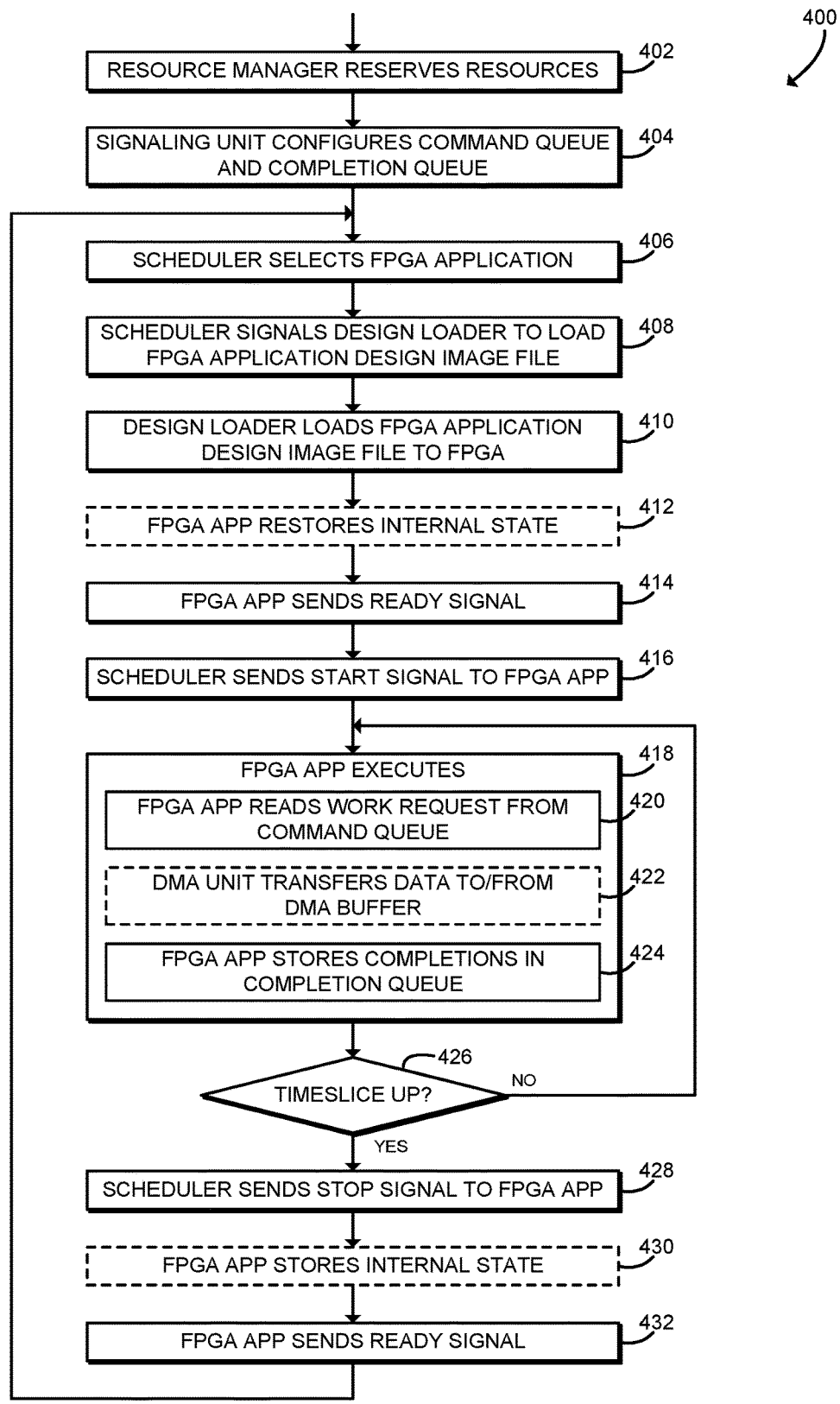
FIG. 4 is a simplified flow diagram of at least one embodiment of a method for providing FAAS capabilities that may be executed by the computing device of FIGS. 1-2.

Referring now to FIG. 4, in use, the computing device 100 may execute a method 400 for providing FPGA infrastructure-as-a-service capabilities. It should be appreciated that, in some embodiments, the operations of the method 400 may be performed by one or more components of the environment 200 of the computing device 100 as shown in FIG. 2. The method 400 begins in block 402, in which the resource manager logic 214 of the computing device 100 reserves one or more resources of the FPGA 130 for use with an FPGA application. For example, the resource manager logic 214 may reserve gates, clocks, I/O bandwidth, available power, local memory, or other resources requested for an FPGA application. The request for FPGA resources may be received from the FPGA middleware library 206 and/or the FPGA driver 208 as described further above in connection with FIG. 3. In some embodiments, the resource manager logic 214 may partition or otherwise isolate resources reserved for the FPGA application from resources reserved for other FPGA applications loaded on the FPGA 130 at the same time. For example, the resource manager logic 214 may reserve a "slice" of FPGA logic cells for each FPGA application that is independent from the logic cells reserved for other FGPA applications. Additionally or alternatively, in some embodiments the resource manager logic 214 may manage multiple FPGAs 130 by reserving an entire FPGA 130 for each FPGA application and isolating the FPGA applications loaded on the multiple FPGAs 130.

In block 404, the signaling unit logic 212 of the computing device 100 configures a command queue and a completion queue for the FPGA application. As described above in connection with FIG. 3, each of the command queue and the completion queue may be embodied as a first-in-first-out (FIFO) queue allocated in the memory 124 of the computing device 100. The signaling unit logic 212 may configure the command queue and completion queue for direct memory access (DMA) operations or other memory accesses by the FPGA 130. The command queue and the completion queue may be used to transfer commands and other signals between the FPGA 130 and the user process 202.

In block 406, the scheduler logic 216 of the computing device 100 selects an FPGA application for execution. As described above in connection with FIG. 3, the scheduler logic 216 may receive a command or other signal from the FPGA driver 208 to schedule the FPGA application for execution. In some embodiments, the scheduler logic 216 may receive commands to schedule multiple FPGA applications for execution, for example from multiple user processes 202. The scheduler logic 216 may use any appropriate scheduling algorithm to select the next FPGA application for execution. For example, in some embodiments the FPGA 130 may be time-shared by multiple FPGA applications and thus the scheduler logic 216 may use a time-sharing task scheduling algorithm. As another example, in some embodiments the FPGA 130 may be partitioned among multiple tenants and/or the computing device 100 may include multiple FPGAs 130, and thus the scheduler logic 216 may identify multiple FPGA applications to load and execute at the same time using a space-sharing task scheduling algorithm.

In block 408, the scheduler logic 216 signals the design loader logic 218 to load the FPGA application design 204 for the selected FPGA application. In block 410, the design loader logic 218 loads the FPGA application design 204 to the FGPA 130. As described above in connection with FIG. 3, the FPGA application design 204 may be provided by the FPGA middleware library 206 and/or the FPGA driver 208 to the design loader logic 218. As described above, the FPGA application design 204 may be embodied as a an FPGA design image file such as a bitstream, a VHDL program, and/or any other module definition for the FPGA 130. After being loaded with the FPGA image, the FPGA 130 is capable of performing the hardware functions defined by the FPGA application design 204.

In some embodiments, in block 412, after being loaded, the FPGA application executed by the FPGA 130 may restore an internal state of the FPGA application. For example, in embodiments in which the FPGA 130 is time-shared by multiple FPGA applications, each FPGA application may restore an internal state that was stored when the FPGA application was previously unloaded from the FPGA 130. The internal state may be stored in the memory 124, the data storage device 126, and/or any other appropriate storage location of the computing device 100.

After being loaded, and in some embodiments after restoring its internal state, in block 414 the FPGA application executed by the FPGA 130 sends a ready signal to the scheduler logic 216. In block 416, after receiving the ready signal, the scheduler logic 216 sends a start signal to the FPGA application executed by the FPGA 130.

In block 418, the FPGA application executes using the resources of the FPGA 130. For example, the FPGA application may perform computations or other logical operations using logic cells or other computing resources of the FPGA 130. In block 420, the FPGA application may read a work request from the command queue. As described above in connection with FIG. 3, the user process 202, the FPGA middleware library 206, and/or the FPGA driver 208 may queue the work request in the command queue. In response to reading the work request, the FPGA application may begin processing using the FGPA resources. In some embodiments, in block 422 the DMA logic 210 may transfer data to and/or from one or more DMA data buffers in the memory 124. As described above in connection with FIG. 3, the data buffers may include application data provided by the user process 202. The FPGA application may also store results data in the DMA data buffers. In block 424, after processing the work request, the FPGA application stores a completion in the completion queue. As described above in connection with FIG. 3, the user process 202 may read the completion and continue executing. The FPGA application may continue to process work requests and generate completions using the resources of the FPGA 130. Accesses by the FGPA 130 to the memory 124 (including to the command queue, the completion queue, and/or the DMA data buffers) may be performed using an I/O memory management unit (IOMMU) of the computing device 100. By using the IOMMU, the FPGA application executed by the FPGA 130 may be limited to the virtual memory space of the associated user process 202. For example, access restrictions may be enforced by Intel® Virtualization Technology for Directed I/O (VT-d) provided by certain computing devices 100. Thus, the FPGA application may not access data or commands directed to other FPGA applications, even when those applications are executed by the same FPGA 130.

The illustrative method 400 shows a usage model in which the FPGA 130 offloads processor 120 data processing activities, returning the results back to software. It should be understood that in some embodiments the computing device 100 may also provide alternatively usage models. For example, in some embodiments, the FPGA 130 may be positioned between the processor 120 and one or more I/O devices such as a network interface controller (NIC). Continuing that example, in an FPGA virtual switch (VSwitch) offload usage model, software executed by the processor 120 may send packets to the network. Each packet may be parsed and switched by the FPGA application executed by the FPGA 130, and then the FPGA 130 may send the packets directly to the communication subsystem 128 (e.g., to one or more NIC transmission queues). The FPGA application may perform similar operations for packets in the receive path.

In block 426, the scheduler logic 216 may determine whether a timeslice has expired. As described above, in some embodiments, the scheduler logic 216 may implement time-sharing of the FPGA 130 between multiple FPGA applications. In other words, the scheduler logic 216 may allow each FPGA application to execute on the FPGA 130 for a certain period of time (a timeslice) before allowing another FPGA application to execute. The particular timeslice used may be constant or variable and may depend on the design loading/unloading performance of the FPGA 130, the quality-of-service requirements of the FPGA application, and/or other factors. If a timeslice has not expired (or if time-sharing is not being used) the method 400 loops back to block 418 to continue executing the FPGA application. If a timeslice has expired, the method 400 advances to block 428.

In block 428, the scheduler logic 216 sends a stop signal to the FPGA application executed by the FGPA 130. After receiving the stop signal, the FPGA application may perform a shutdown operation or otherwise stop processing. In some embodiments, in block 430 the FPGA application may store the internal state of the FPGA application. As described above in connection with block 412, the internal state may be restored when the FPGA application is loaded for execution in the future. The internal state may be stored in the memory 124, the data storage device 126, and/or any other appropriate storage location of the computing device 100. After the FPGA application has successfully stopped operation, the FPGA application sends a ready signal to the scheduler logic 216. The FPGA application may also ensure that any memory reads and/or writes are consistent (e.g., completed or aborted) before sending the ready signal. After sending the ready signal, the method 400 loops back to block 406, in which the scheduler logic 216 selects another FPGA application for execution and the design loader logic 218 loads the FPGA application design 204 into the FPGA 130.

It should be appreciated that, in some embodiments, the methods 300 and/or 400 may be embodied as various instructions stored on a computer-readable media, which may be executed by the processor 120, the I/O subsystem 122, the FPGA 130, and/or other components of the computing device 100 to cause the computing device 100 to perform the respective method 300 and/or 400. The computer-readable media may be embodied as any type of media capable of being read by the computing device 100 including, but not limited to, the memory 124, the data storage device 126, firmware devices, and/or other media.

EXAMPLES

Illustrative examples of the technologies disclosed herein are provided below. An embodiment of the technologies may include any one or more, and any combination of, the examples described below.

Example 1 includes a computing device for field programmable gate array (FPGA) application execution, the computing device comprising an FPGA, a scheduler logic, and a design loader logic, wherein: the scheduler logic is to select an FPGA application for execution by the FPGA; the design loader logic is to load a design image file of the FPGA application into the FPGA of the computing device in response to selection of the FPGA application; the scheduler logic is further to (i) receive a ready signal from the FPGA application in response to loading of the design image file and (ii) send a start signal to the FPGA application in response to receipt of the ready signal; and the FGPA is to execute the FPGA application in response to sending of the start signal.

Example 2 includes the subject matter of Example 1, and further comprising a signaling logic, wherein to execute the FPGA application comprises to: read a work request from a command queue in a memory of the computing device with the signaling logic; and store a completion to a completion queue in the memory of the computing device with the signaling logic in response to reading of the work request.

Example 3 includes the subject matter of any of Examples 1 and 2, and wherein to execute the FPGA application further comprises to enforce access restrictions to the command queue and the completion queue by an I/O memory management unit (IOMMU) of the computing device.

Example 4 includes the subject matter of any of Examples 1-3, and wherein the signaling logic is further to inspect the command queue and the completion queue to enforce access restrictions of the FPGA application.

Example 5 includes the subject matter of any of Examples 1-4, and further comprising an FPGA library to allocate the command queue and the completion queue, wherein the FPGA library is executed by a processor of the computing device.

Example 6 includes the subject matter of any of Examples 1-5, and further comprising a user process to (i) store the work request in the command queue in response to allocation of the command queue, and (ii) read the completion from the completion queue in response to storage of the completion to the completion queue.

Example 7 includes the subject matter of any of Examples 1-6, and wherein the signaling logic comprises a fixed function hardware logic component of the computing device or the FPGA comprises the signaling logic.

Example 8 includes the subject matter of any of Examples 1-7, and wherein the design image file implements one or more predetermined FPGA interfaces.

Example 9 includes the subject matter of any of Examples 1-8, and further comprising a direct memory access logic, wherein to execute the FPGA application comprises to access a data buffer in a memory of the computing device with the direct memory access logic.

Example 10 includes the subject matter of any of Examples 1-9, and wherein to access the data buffer comprises to enforce access restrictions by an I/O memory management unit (IOMMU) of the computing device.

Example 11 includes the subject matter of any of Examples 1-10, and further comprising an FPGA library to allocate the data buffer of the computing device, wherein the FPGA library is executed by a processor of the computing device.

Example 12 includes the subject matter of any of Examples 1-11, and further comprising a user process to store application data in the data buffer in response to allocation of the data buffer.

Example 13 includes the subject matter of any of Examples 1-12, and wherein the direct memory access logic comprises a fixed function hardware logic component of the computing device or the FPGA comprises the direct memory access logic.

Example 14 includes the subject matter of any of Examples 1-13, and wherein the scheduler logic is further to: determine whether a timeslice has elapsed in response to execution of the FPGA application; send a stop signal to the FPGA application in response to a determination that the timeslice has elapsed; receive a ready signal from the FPGA application in response to sending of the stop signal to the FPGA application; and select a second FPGA application for execution by the FPGA of the computing device in response to the determination that the timeslice has elapsed.

Example 15 includes the subject matter of any of Examples 1-14, and wherein: the FPGA is further to store, by the FPGA application, an internal state of the FPGA application in response to the sending of the stop signal to the FPGA application; and to receive the ready signal from the FPGA application in response to the sending of the stop signal to the FPGA application further comprises to receive the ready signal from the FPGA application in response to storage of the internal state of the FGPA application.

Example 16 includes the subject matter of any of Examples 1-15, and wherein: the FPGA is further to restore, by the FPGA application, the internal state of the FPGA application in response to the loading of the design image file of the FPGA application into the FPGA; and to receive the ready signal from the FPGA application in response to the loading of the design image file further comprises to receive the ready signal in response to restoration of the internal state of the FPGA application.

Example 17 includes the subject matter of any of Examples 1-16, and further comprising a resource manager logic to reserve one or more resources of the FPGA for the FPGA application.

Example 18 includes the subject matter of any of Examples 1-17, and wherein the resource manager logic is further to prevent an access by the FPGA application to one or more resources of the FPGA that are reserved for a second FGPA application.

Example 19 includes the subject matter of any of Examples 1-18, and wherein: the scheduler logic is further to select a second FPGA application for execution by the FPGA of the computing device; the resource manager logic is further to reserve one or more resources of the FPGA for the second FPGA application; and the design loader logic is further to load a design image file of the second FPGA application into the FPGA of the computing device in response to reservation of the one or more resources of the FPGA for the second FPGA application.

Example 20 includes the subject matter of any of Examples 1-19, and wherein: the scheduler logic is further to select a second FPGA application for execution by a second FPGA of the computing device; the resource manager logic is further to reserve one or more resources of the second FPGA for the second FPGA application; and the design loader logic is further to load a design image file of the second FPGA application into the second FPGA of the computing device in response to reservation of the one or more resources of the second FPGA for the second FPGA application.

Example 21 includes the subject matter of any of Examples 1-20, and further comprising a user process and an FPGA library, wherein: the user process is to request the FPGA library to reserve the one or more resources of the FGPA for the FPGA application, wherein the FPGA library is executed by a processor of the computing device; and to reserve the one or more resources comprises to reserve, by the resource manager logic, the one or more resources of the FPGA for the FPGA application in response to a request to the FPGA library.

Example 22 includes the subject matter of any of Examples 1-21, and wherein the resource manager logic comprises a fixed function hardware logic component of the computing device or the FPGA comprises the resource manager logic.

Example 23 includes the subject matter of any of Examples 1-22, and further comprising a user process linked with an FPGA library, wherein the FGPA library is executed by a processor of the computing device.

Example 24 includes the subject matter of any of Examples 1-23, and wherein the user process is further to query the FPGA library for capabilities of the FPGA.

Example 25 includes the subject matter of any of Examples 1-24, and wherein: the user process is further to specify the design image file of the FPGA application to the FPGA library; and to load the design image file comprises to load, by the design loader logic, the design image file of the FPGA application into the FPGA in response to specification of the design image file of the FPGA application to the FPGA library.

Example 26 includes the subject matter of any of Examples 1-25, and wherein: the user process is further to register an event callback with the FPGA library; and the FPGA library is further to invoke the event callback in response to execution of the FPGA application.

Example 27 includes the subject matter of any of Examples 1-26, and wherein to invoke the event callback comprises to invoke the event callback in response to storage, by the FGPA, of a completion to a completion queue in the memory of the computing device.

Example 28 includes the subject matter of any of Examples 1-27, and wherein: the user process is further to invoke the FPGA library to start the FPGA application; and to select the FPGA application comprises to select the FPGA application in response to invocation of the FPGA library to start the FPGA application.

Example 29 includes the subject matter of any of Examples 1-28 and wherein the scheduler logic and the design loader logic each comprise a fixed function hardware logic component of the computing device.

Example 30 includes the subject matter of any of Examples 1-29, and wherein the FGPA comprises the scheduler logic and the design loader logic.

Example 31 includes a method for field programmable gate array (FPGA) application execution, the method comprising: selecting, by a scheduler logic of a computing device, an FPGA application for execution by an FPGA of the computing device; loading, by a design loader logic of the computing device, a design image file of the FPGA application into the FPGA of the computing device in response to selecting the FPGA application; receiving, by the scheduler logic, a ready signal from the FPGA application in response to loading the design image file; sending, by the scheduler logic, a start signal to the FPGA application in response to receiving the ready signal; and executing, by the FPGA, the FPGA application in response to sending the start signal.

Example 32 includes the subject matter of Example 31, and wherein executing the FPGA application comprises: reading, by the FPGA, a work request from a command queue in a memory of the computing device using a signaling logic of the computing device; and storing, by the FPGA, a completion to a completion queue in the memory of the computing device using the signaling logic in response to reading the work request.

Example 33 includes the subject matter of any of Examples 31 and 32, and wherein executing the FPGA application further comprises enforcing access restrictions to the command queue and the completion queue by an I/O memory management unit (IOMMU) of the computing device.

Example 34 includes the subject matter of any of Examples 31-33, and further comprising inspecting the command queue and the completion queue by the signaling logic to enforce access restrictions of the FPGA application.

Example 35 includes the subject matter of any of Examples 31-34, and further comprising allocating the command queue and the completion queue by an FPGA library of the computing device, wherein the FPGA library is executed by a processor of the computing device.

Example 36 includes the subject matter of any of Examples 31-35, and further comprising: storing, by a user process of the computing device, the work request in the command queue in response to allocating the command queue; and reading, by the user process, the completion from the completion queue in response to storing the completion to the completion queue.

Example 37 includes the subject matter of any of Examples 31-36, and wherein the signaling logic comprises a fixed function hardware logic component of the computing device or the FPGA comprises the signaling logic.

Example 38 includes the subject matter of any of Examples 31-37, and wherein loading the design image file comprises loading a design image file that implements one or more predetermined FPGA interfaces.

Example 39 includes the subject matter of any of Examples 31-38, and wherein executing the FPGA application comprises accessing, by the FPGA, a data buffer in a memory of the computing device using a direct memory access logic of the computing device.

Example 40 includes the subject matter of any of Examples 31-39, and wherein accessing the data buffer comprises enforcing access restrictions by an I/O memory management unit (IOMMU) of the computing device.

Example 41 includes the subject matter of any of Examples 31-40, and further comprising allocating the data buffer by an FPGA library of the computing device, wherein the FPGA library is executed by a processor of the computing device.

Example 42 includes the subject matter of any of Examples 31-41, and further comprising storing, by a user process of the computing device, application data in the data buffer in response to allocating the data buffer.

Example 43 includes the subject matter of any of Examples 31-42, and wherein the direct memory access logic comprises a fixed function hardware logic component of the computing device or the FPGA comprises the direct memory access logic.

Example 44 includes the subject matter of any of Examples 31-43, and further comprising: determining, by the scheduler logic, whether a timeslice has elapsed in response to executing the FPGA application; sending, by the scheduler logic, a stop signal to the FPGA application in response to determining that the timeslice has elapsed; receiving, by the scheduler logic, a ready signal from the FPGA application in response to sending the stop signal to the FPGA application; and selecting, by the scheduler logic, a second FPGA application for execution by the FPGA of the computing device in response to determining that the timeslice has elapsed.

Example 45 includes the subject matter of any of Examples 31-44, and further comprising: storing, by the FPGA application, an internal state of the FPGA application in response to sending the stop signal to the FPGA application; wherein receiving the ready signal from the FPGA application in response to sending the stop signal to the FPGA application further comprises receiving the ready signal from the FPGA application in response to storing the internal state of the FGPA application.

Example 46 includes the subject matter of any of Examples 31-45, and further comprising: restoring, by the FPGA application, the internal state of the FPGA application in response to loading the design image file of the FPGA application into the FPGA; wherein receiving the ready signal from the FPGA application in response to loading the design image file further comprises receiving the ready signal in response to restoring the internal state of the FPGA application.

Example 47 includes the subject matter of any of Examples 31-46, and further comprising reserving, by a resource manager logic of the computing device, one or more resources of the FPGA for the FPGA application.

Example 48 includes the subject matter of any of Examples 31-47, and further comprising preventing, by the resource manager logic, an access by the FPGA application to one or more resources of the FPGA that are reserved for a second FGPA application.

Example 49 includes the subject matter of any of Examples 31-48, and further comprising: selecting, by the scheduler logic, a second FPGA application for execution by the FPGA of the computing device; reserving, by the resource manager logic, one or more resources of the FPGA for the second FPGA application; and loading, by the design loader logic, a design image file of the second FPGA application into the FPGA of the computing device in response to reserving the one or more resources of the FPGA for the second FPGA application.

Example 50 includes the subject matter of any of Examples 31-49, and further comprising: selecting, by the scheduler logic, a second FPGA application for execution by a second FPGA of the computing device; reserving, by the resource manager logic, one or more resources of the second FPGA for the second FPGA application; and loading, by the design loader logic, a design image file of the second FPGA application into the second FPGA of the computing device in response to reserving the one or more resources of the second FPGA for the second FPGA application.

Example 51 includes the subject matter of any of Examples 31-50, and further comprising: requesting, by a user process of the computing device, an FPGA library of the computing device to reserve the one or more resources of the FGPA for the FPGA application, wherein the FPGA library is executed by a processor of the computing device; wherein reserving the one or more resources comprises reserving, by the resource manager logic, the one or more resources of the FPGA for the FPGA application in response to requesting the FPGA library.

Example 52 includes the subject matter of any of Examples 31-51, and wherein the resource manager logic comprises a fixed function hardware logic component of the computing device or the FPGA comprises the resource manager logic.

Example 53 includes the subject matter of any of Examples 31-52, and further comprising linking, by the computing device, a user process with an FPGA library executed by a processor of the computing device.

Example 54 includes the subject matter of any of Examples 31-53, and further comprising querying, by the user process, the FPGA library for capabilities of the FPGA.

Example 55 includes the subject matter of any of Examples 31-54, and further comprising: specifying, by the user process to the FPGA library, the design image file of the FPGA application; wherein loading the design image file comprises loading, by the design loader logic, the design image file of the FPGA application into the FPGA in response to specifying, by the user process to the FPGA library, the design image file of the FPGA application.

Example 56 includes the subject matter of any of Examples 31-55, and further comprising: registering, by the user process, an event callback with the FPGA library; and invoking, by the FPGA library, the event callback in response to executing the FPGA application.

Example 57 includes the subject matter of any of Examples 31-56, and wherein invoking the event callback comprises invoking the event callback in response to storing, by the FGPA, a completion to a completion queue in the memory of the computing device.

Example 58 includes the subject matter of any of Examples 31-57, and further comprising: invoking, by the user process, the FPGA library to start the FPGA application; wherein selecting the FPGA application comprises selecting the FPGA application in response to invoking the FPGA library to start the FPGA application.

Example 59 includes the subject matter of any of Examples 31-58, and wherein the scheduler logic and the design loader logic each comprise a fixed function hardware logic component of the computing device.

Example 60 includes the subject matter of any of Examples 31-59, and wherein the FGPA comprises the scheduler logic and the design loader logic.

Example 61 includes a computing device comprising: a processor; and a memory having stored therein a plurality of instructions that when executed by the processor cause the computing device to perform the method of any of Examples 31-60.

Example 62 includes one or more machine readable storage media comprising a plurality of instructions stored thereon that in response to being executed result in a computing device performing the method of any of Examples 31-60.

Example 63 includes a computing device comprising means for performing the method of any of Examples 31-60.

Example 64 includes a computing device for field programmable gate array (FPGA) application execution, the computing device comprising: means for selecting, by a scheduler logic of the computing device, an FPGA application for execution by an FPGA of the computing device; means for loading, by a design loader logic of the computing device, a design image file of the FPGA application into the FPGA of the computing device in response to selecting the FPGA application; means for receiving, by the scheduler logic, a ready signal from the FPGA application in response to loading the design image file; means for sending, by the scheduler logic, a start signal to the FPGA application in response to receiving the ready signal; and means for executing, by the FPGA, the FPGA application in response to sending the start signal.

Example 65 includes the subject matter of Example 64, and wherein executing the FPGA application comprises: means for reading, by the FPGA, a work request from a command queue in a memory of the computing device using a signaling logic of the computing device; and means for storing, by the FPGA, a completion to a completion queue in the memory of the computing device using the signaling logic in response to reading the work request.

Example 66 includes the subject matter of any of Examples 64 and 65, and wherein the means for executing the FPGA application further comprises means for enforcing access restrictions to the command queue and the completion queue by an I/O memory management unit (IOMMU) of the computing device.

Example 67 includes the subject matter of any of Examples 64-66, and further comprising means for inspecting the command queue and the completion queue by the signaling logic to enforce access restrictions of the FPGA application.

Example 68 includes the subject matter of any of Examples 64-67, and further comprising means for allocating the command queue and the completion queue by an FPGA library of the computing device, wherein the FPGA library is executed by a processor of the computing device.

Example 69 includes the subject matter of any of Examples 64-68, and further comprising: means for storing, by a user process of the computing device, the work request in the command queue in response to allocating the command queue; and means for reading, by the user process, the completion from the completion queue in response to storing the completion to the completion queue.

Example 70 includes the subject matter of any of Examples 64-69, and wherein the signaling logic comprises a fixed function hardware logic component of the computing device or the FPGA comprises the signaling logic.

Example 71 includes the subject matter of any of Examples 64-70, and wherein the means for loading the design image file comprises means for loading a design image file that implements one or more predetermined FPGA interfaces.

Example 72 includes the subject matter of any of Examples 64-71, and wherein the means for executing the FPGA application comprises means for accessing, by the FPGA, a data buffer in a memory of the computing device using a direct memory access logic of the computing device.

Example 73 includes the subject matter of any of Examples 64-72, and wherein the means for accessing the data buffer comprises means for enforcing access restrictions by an I/O memory management unit (IOMMU) of the computing device.

Example 74 includes the subject matter of any of Examples 64-73, and further comprising means for allocating the data buffer by an FPGA library of the computing device, wherein the FPGA library is executed by a processor of the computing device.

Example 75 includes the subject matter of any of Examples 64-74, and further comprising means for storing, by a user process of the computing device, application data in the data buffer in response to allocating the data buffer.

Example 76 includes the subject matter of any of Examples 64-75, and wherein the direct memory access logic comprises a fixed function hardware logic component of the computing device or the FPGA comprises the direct memory access logic.

Example 77 includes the subject matter of any of Examples 64-76, and further comprising: means for determining, by the scheduler logic, whether a timeslice has elapsed in response to executing the FPGA application; means for sending, by the scheduler logic, a stop signal to the FPGA application in response to determining that the timeslice has elapsed; means for receiving, by the scheduler logic, a ready signal from the FPGA application in response to sending the stop signal to the FPGA application; and means for selecting, by the scheduler logic, a second FPGA application for execution by the FPGA of the computing device in response to determining that the timeslice has elapsed.

Example 78 includes the subject matter of any of Examples 64-77, and further comprising: means for storing, by the FPGA application, an internal state of the FPGA application in response to sending the stop signal to the FPGA application; wherein the means for receiving the ready signal from the FPGA application in response to sending the stop signal to the FPGA application further comprises means for receiving the ready signal from the FPGA application in response to storing the internal state of the FGPA application.

Example 79 includes the subject matter of any of Examples 64-78, and further comprising: means for restoring, by the FPGA application, the internal state of the FPGA application in response to loading the design image file of the FPGA application into the FPGA; wherein the means for receiving the ready signal from the FPGA application in response to loading the design image file further comprises means for receiving the ready signal in response to restoring the internal state of the FPGA application.

Example 80 includes the subject matter of any of Examples 64-79, and further comprising means for reserving, by a resource manager logic of the computing device, one or more resources of the FPGA for the FPGA application.

Example 81 includes the subject matter of any of Examples 64-80, and further comprising means for preventing, by the resource manager logic, an access by the FPGA application to one or more resources of the FPGA that are reserved for a second FGPA application.

Example 82 includes the subject matter of any of Examples 64-81, and further comprising: means for selecting, by the scheduler logic, a second FPGA application for execution by the FPGA of the computing device; means for reserving, by the resource manager logic, one or more resources of the FPGA for the second FPGA application; and means for loading, by the design loader logic, a design image file of the second FPGA application into the FPGA of the computing device in response to reserving the one or more resources of the FPGA for the second FPGA application.

Example 83 includes the subject matter of any of Examples 64-82, and further comprising: means for selecting, by the scheduler logic, a second FPGA application for execution by a second FPGA of the computing device; means for reserving, by the resource manager logic, one or more resources of the second FPGA for the second FPGA application; and means for loading, by the design loader logic, a design image file of the second FPGA application into the second FPGA of the computing device in response to reserving the one or more resources of the second FPGA for the second FPGA application.

Example 84 includes the subject matter of any of Examples 64-83, and further comprising: means for requesting, by a user process of the computing device, an FPGA library of the computing device to reserve the one or more resources of the FGPA for the FPGA application, wherein the FPGA library is executed by a processor of the computing device; wherein the means for reserving the one or more resources comprises means for reserving, by the resource manager logic, the one or more resources of the FPGA for the FPGA application in response to requesting the FPGA library.

Example 85 includes the subject matter of any of Examples 64-84, and wherein the resource manager logic comprises a fixed function hardware logic component of the computing device or the FPGA comprises the resource manager logic.

Example 86 includes the subject matter of any of Examples 64-85, and further comprising means for linking a user process with an FPGA library executed by a processor of the computing device.

Example 87 includes the subject matter of any of Examples 64-86, and further comprising means for querying, by the user process, the FPGA library for capabilities of the FPGA.

Example 88 includes the subject matter of any of Examples 64-87 and further comprising: means for specifying, by the user process to the FPGA library, the design image file of the FPGA application; wherein the means for loading the design image file comprises means for loading, by the design loader logic, the design image file of the FPGA application into the FPGA in response to specifying, by the user process to the FPGA library, the design image file of the FPGA application.

Example 89 includes the subject matter of any of Examples 64-88, and further comprising: means for registering, by the user process, an event callback with the FPGA library; and means for invoking, by the FPGA library, the event callback in response to executing the FPGA application.

Example 90 includes the subject matter of any of Examples 64-89, and wherein the means for invoking the event callback comprises means for invoking the event callback in response to storing, by the FGPA, a completion to a completion queue in the memory of the computing device.

Example 91 includes the subject matter of any of Examples 64-90, and further comprising: means for invoking, by the user process, the FPGA library to start the FPGA application; wherein the means for selecting the FPGA application comprises means for selecting the FPGA application in response to invoking the FPGA library to start the FPGA application.

Example 92 includes the subject matter of any of Examples 64-91, and wherein the scheduler logic and the design loader logic each comprise a fixed function hardware logic component of the computing device.

Example 93 includes the subject matter of any of Examples 64-92, and wherein the FGPA comprises the scheduler logic and the design loader logic.

The invention claimed is:

1. A computing device for field programmable gate array (FPGA) application execution, the computing device comprising an FPGA, a scheduler hardware logic, and a design loader hardware logic, wherein:
the scheduler hardware logic is to select an FPGA application for execution by the FPGA;
the design loader hardware logic is to load a design image file of the FPGA application into the FPGA of the computing device in response to selection of the FPGA application;
the scheduler hardware logic is further to (i) receive a ready signal from the FPGA application in response to loading of the design image file and (ii) send a start signal to the FPGA application in response to receipt of the ready signal; and
the FGPA is to execute the FPGA application in response to sending of the start signal.

2. The computing device of claim 1, further comprising a signaling hardware logic, wherein to execute the FPGA application comprises to:
read a work request from a command queue in a memory of the computing device with the signaling hardware logic; and
store a completion to a completion queue in the memory of the computing device with the signaling hardware logic in response to reading of the work request.

3. The computing device of claim 2, wherein to execute the FPGA application further comprises to enforce access restrictions to the command queue and the completion queue by an I/O memory management unit (IOMMU) of the computing device.

4. The computing device of claim 1, further comprising a direct memory access hardware logic, wherein to execute the FPGA application comprises to access a data buffer in a memory of the computing device with the direct memory access hardware logic.

5. The computing device of claim 1, wherein the scheduler hardware logic is further to:
determine whether a timeslice has elapsed in response to execution of the FPGA application;
send a stop signal to the FPGA application in response to a determination that the timeslice has elapsed;
receive a ready signal from the FPGA application in response to sending of the stop signal to the FPGA application; and
select a second FPGA application for execution by the FPGA of the computing device in response to the determination that the timeslice has elapsed.

6. The computing device of claim 5, wherein:
the FPGA is further to store, by the FPGA application, an internal state of the FPGA application in response to the sending of the stop signal to the FPGA application; and
to receive the ready signal from the FPGA application in response to the sending of the stop signal to the FPGA application further comprises to receive the ready signal from the FPGA application in response to storage of the internal state of the FGPA application.

7. The computing device of claim 6, wherein:
the FPGA is further to restore, by the FPGA application, the internal state of the FPGA application in response to the loading of the design image file of the FPGA application into the FPGA; and
to receive the ready signal from the FPGA application in response to the loading of the design image file further comprises to receive the ready signal in response to restoration of the internal state of the FPGA application.

8. The computing device of claim 1, further comprising a resource manager hardware logic to reserve one or more resources of the FPGA for the FPGA application.

9. The computing device of claim 8, wherein:
the scheduler hardware logic is further to select a second FPGA application for execution by the FPGA of the computing device;
the resource manager hardware logic is further to reserve one or more resources of the FPGA for the second FPGA application; and
the design loader hardware logic is further to load a design image file of the second FPGA application into the FPGA of the computing device in response to reservation of the one or more resources of the FPGA for the second FPGA application.

10. The computing device of claim 1, further comprising a user process linked with an FPGA library, wherein the FGPA library is executed by a processor of the computing device.

11. The computing device of claim 10, wherein:
the user process is further to register an event callback with the FPGA library; and
the FPGA library is further to invoke the event callback in response to execution of the FPGA application.

12. The computing device of claim 1, wherein the scheduler hardware logic and the design loader hardware logic each comprise a fixed function hardware logic component of the computing device.

13. The computing device of claim 1, wherein the FGPA comprises the scheduler hardware logic and the design loader hardware logic.

14. A method for field programmable gate array (FPGA) application execution, the method comprising:
selecting, by a scheduler hardware logic of a computing device, an FPGA application for execution by an FPGA of the computing device;
loading, by a design loader hardware logic of the computing device, a design image file of the FPGA application into the FPGA of the computing device in response to selecting the FPGA application;
receiving, by the scheduler hardware logic, a ready signal from the FPGA application in response to loading the design image file;
sending, by the scheduler hardware logic, a start signal to the FPGA application in response to receiving the ready signal; and
executing, by the FPGA, the FPGA application in response to sending the start signal.

15. The method of claim 14, wherein executing the FPGA application comprises:
reading, by the FPGA, a work request from a command queue in a memory of the computing device using a signaling hardware logic of the computing device; and
storing, by the FPGA, a completion to a completion queue in the memory of the computing device using the signaling hardware logic in response to reading the work request.

16. The method of claim 14, wherein executing the FPGA application comprises accessing, by the FPGA, a data buffer in a memory of the computing device using a direct memory access hardware logic of the computing device.

17. The method of claim 14, further comprising:
determining, by the scheduler hardware logic, whether a timeslice has elapsed in response to executing the FPGA application;
sending, by the scheduler hardware logic, a stop signal to the FPGA application in response to determining that the timeslice has elapsed;
receiving, by the scheduler hardware logic, a ready signal from the FPGA application in response to sending the stop signal to the FPGA application; and
selecting, by the scheduler hardware logic, a second FPGA application for execution by the FPGA of the computing device in response to determining that the timeslice has elapsed.

18. The method of claim 14, further comprising reserving, by a resource manager hardware logic of the computing device, one or more resources of the FPGA for the FPGA application.

19. The method of claim 14, further comprising linking, by the computing device, a user process with an FPGA library executed by a processor of the computing device.

20. One or more computer-readable storage media comprising a plurality of instructions that in response to being executed cause a computing device to:
select, by a scheduler hardware logic of the computing device, an FPGA application for execution by an FPGA of the computing device;
load, by a design loader hardware logic of the computing device, a design image file of the FPGA application into the FPGA of the computing device in response to selecting the FPGA application;
receive, by the scheduler hardware logic, a ready signal from the FPGA application in response to loading the design image file;
send, by the scheduler hardware logic, a start signal to the FPGA application in response to receiving the ready signal; and
execute, by the FPGA, the FPGA application in response to sending the start signal.

21. The one or more computer-readable storage media of claim 20, wherein to execute the FPGA application comprises to:
read, by the FPGA, a work request from a command queue in a memory of the computing device using a signaling hardware logic of the computing device; and
store, by the FPGA, a completion to a completion queue in the memory of the computing device using the signaling hardware logic in response to reading the work request.

22. The one or more computer-readable storage media of claim 20, wherein to execute the FPGA application comprises to access, by the FPGA, a data buffer in a memory of the computing device using a direct memory access hardware logic of the computing device.

23. The one or more computer-readable storage media of claim 20, further comprising a plurality of instructions that in response to being executed cause the computing device to:
determine, by the scheduler hardware logic, whether a timeslice has elapsed in response to executing the FPGA application;
send, by the scheduler hardware logic, a stop signal to the FPGA application in response to determining that the timeslice has elapsed;
receive, by the scheduler hardware logic, a ready signal from the FPGA application in response to sending the stop signal to the FPGA application; and
select, by the scheduler hardware logic, a second FPGA application for execution by the FPGA of the computing device in response to determining that the timeslice has elapsed.

24. The one or more computer-readable storage media of claim 20, further comprising a plurality of instructions that in response to being executed cause the computing device to reserve, by a resource manager hardware logic of the computing device, one or more resources of the FPGA for the FPGA application.

25. The one or more computer-readable storage media of claim 20, further comprising a plurality of instructions that in response to being executed cause the computing device to link a user process with an FPGA library executed by a processor of the computing device.

* * * * *